(12) United States Patent
Lee et al.

(10) Patent No.: US 7,819,652 B2
(45) Date of Patent: Oct. 26, 2010

(54) MOLD FOR NANO-IMPRINTING AND METHOD OF MANUFACTURING THE SAME

(75) Inventors: Du Hyun Lee, Suwon-si (KR); Jin Seung Sohn, Seoul (KR); Byung Kyu Lee, Seoul (KR); Eun Hyoung Cho, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 648 days.

(21) Appl. No.: 11/710,431

(22) Filed: Feb. 26, 2007

(65) Prior Publication Data

US 2008/0061214 A1    Mar. 13, 2008

(30) Foreign Application Priority Data

Sep. 13, 2006    (KR) ............... 10-2006-0088629

(51) Int. Cl.
*B29C 59/00* (2006.01)
(52) U.S. Cl. .............. 425/385; 425/174.4; 264/293
(58) Field of Classification Search ......... 425/385, 425/174.4; 264/293
See application file for complete search history.

(56) References Cited

U.S. PATENT DOCUMENTS

| | | | |
|---|---|---|---|
| 6,030,556 A * | 2/2000 | DePuydt et al. ........... 264/1.37 |
| 6,696,220 B2 * | 2/2004 | Bailey et al. .............. 425/385 |
| 2004/0191700 A1 * | 9/2004 | Kuwabara et al. .......... 430/320 |
| 2005/0116299 A1 * | 6/2005 | Koning et al. ............. 257/374 |
| 2005/0236360 A1 * | 10/2005 | Watts et al. ............... 216/41 |
| 2006/0290026 A1 * | 12/2006 | Chae et al. ............... 264/219 |
| 2007/0090574 A1 * | 4/2007 | Terasaki et al. ............ 264/496 |

* cited by examiner

*Primary Examiner*—Maria Veronica D Ewald
(74) *Attorney, Agent, or Firm*—Sughrue Mion, PLLC

(57) ABSTRACT

A nano-imprint mold and a method of manufacturing the same are provided, which can be used for replicating a nano-scaled structure to a polymer layer. The nano-imprint mold comprises: a substrate; a pattern portion having a prominence and depression pattern formed on the substrate; a hard layer formed of a material with a hardness higher than the pattern portion on a surface of the pattern portion; and a separation layer formed on a surface of the hard layer. In the nano-imprint mold of the present invention, an original pattern can be uniformly replicated even on a substrate with an irregular surface. Further, the pattern can be prevented from being damaged by pressure and being contaminated by synthetic resin, resulting in better accuracy and durability of the pattern.

4 Claims, 2 Drawing Sheets

MOLD FOR NANO-IMPRINTING AND METHOD OF MANUFACTURING THE SAME

CROSS-REFERENCE TO RELATED PATENT APPLICATIONS

This application claims priority from Korean Patent Application No. 10-2006-0088629, filed on Sep. 13, 2006, in the Korean Intellectual Property Office, the disclosure of which is incorporated herein in its entirety by reference.

BACKGROUND OF THE INVENTION

1. Field of the Invention

Apparatuses and methods consistent with the present invention relate to a mold for nano-imprinting and a method of manufacturing the same and, more particularly, to a mold for nano-imprinting and a method of manufacturing the same, which can be used for replicating a nano-scaled structure to a polymer thin film.

2. Description of the Prior Art

Generally, a conventional mold for nano-imprinting is made of only one of hard quartz, glass, or a soft polymer, and integrated with a pattern. However, since the nano-imprint mold using quartz or glass is made through a dry-etching process after a lithography process, it is difficult to manufacture the nano-imprint mold. Further, the mold made of quartz or glass is hard. Therefore, if a substrate on which a pattern is carved has an irregular surface, the contact between the mold and substrate is irregular, and thereby causes the imprint to be irregularly formed. Further, the irregular surface of the substrate can damage the mold used for the imprint.

On the other hand, the imprint mold made of a soft polymer can be easily manufactured through a replication process by a master made in advance. It is expected that the mold can come in uniform contact with the substrate on which the pattern is carved in a greater area because of the flexibility of the mold. However, there is a problem in that a nano-pattern can be damaged and deformed in an imprint process due to the flexibility of the mold.

SUMMARY OF THE INVENTION

Accordingly, exemplary embodiments of the present invention have been made to address the above-mentioned problems occurring in the prior art, and it is an aspect of the present invention to provide a mold for nano-imprinting, which can be manufactured by uniformly replicating an original pattern on a substrate having an irregular surface, and have an improved durability, so that damage thereto can be prevented.

It is another aspect of the present invention to provide a method for easily manufacturing a nano-imprint mold.

According to one aspect of the present invention, there is provided a nano-imprint mold, which comprises: a substrate; a pattern portion having a prominence and depression pattern formed on the substrate; a hard layer formed of a material with a hardness higher than the pattern portion on a surface of the pattern portion; and a separation layer formed on a surface of the hard layer.

According to an exemplary embodiment of the present invention, the substrate is formed of a material through which ultraviolet ray is permeable, and the pattern portion has the prominence and depression pattern formed on a buffer layer covering an entire surface of the substrate.

According to an exemplary embodiment of the present invention, the pattern portion is formed of a material of an ultraviolet cured polymer, and the hard layer is formed of a material selected from at least one of a silicon oxide or Indium Tin Oxide (ITO) or of a metal material of Aluminum (Al), Chrome (Cr), Tantalum (Ta), and Nickel (Ni).

The separation layer is formed of a Self Assembled Monolayer (SAM) based on organosilicon group.

According to another aspect of the present invention, there is provided a method of manufacturing a nano-imprint mold, which comprises: forming a polymer layer on a substrate; forming a nano-sized prominence and depression pattern on the polymer layer after the substrate is covered with a desired master mold and ultraviolet rays are emitted to the substrate; forming a hard layer on a surface of the prominence and depression pattern, the hard layer being formed of a material with hardness higher than the polymer layer; and forming a separation layer on a surface of the hard layer.

According to an exemplary embodiment of the present invention, the prominence and depression pattern is formed in a manner of replicating the nano-pattern of the master mold to the substrate.

According to an exemplary embodiment of the present invention, in forming the separation layer on the surface of the hard layer, the surface of the hard layer is treated with at least one of oxygen plasma, ultraviolet, and ozone.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF EXEMPLARY EMBODIMENTS OF THE INVENTION

Hereinafter, the present invention will be described in detail with reference to the accompanying drawings.

Figure 1:
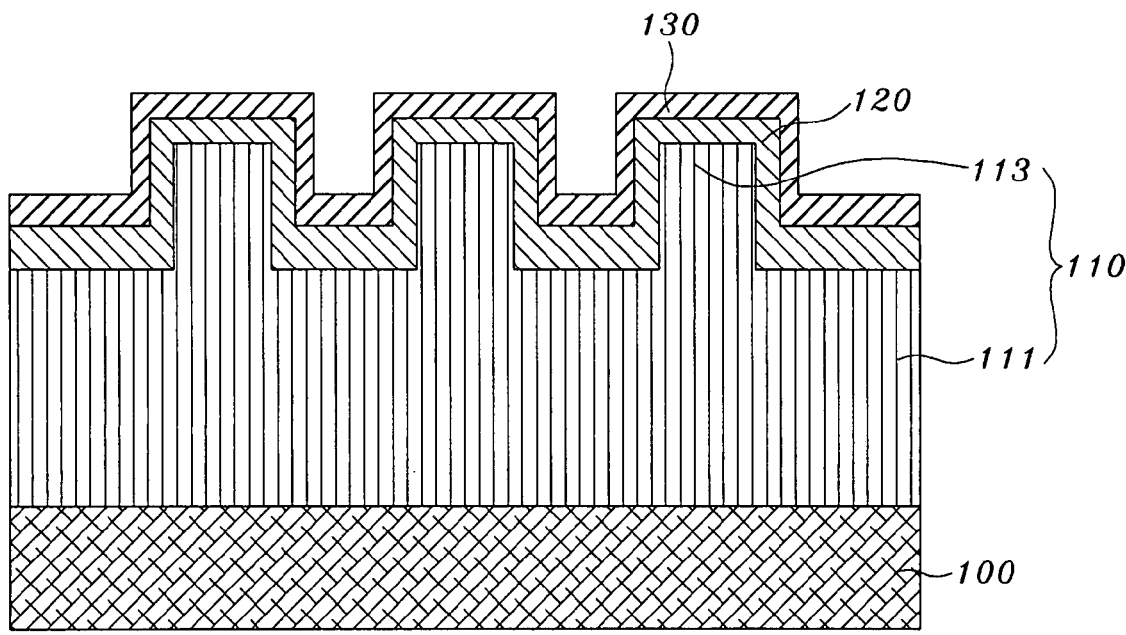
FIG. 1 is a sectional view showing a mold for nano-imprinting according to an exemplary embodiment of the present invention.

FIG. 1 is a sectional view showing a nano-imprint mold according to an exemplary embodiment of the present invention.

As shown in FIG. 1, the nano-imprint mold consistent with the present invention comprises a substrate 100, a pattern portion 110 formed on the substrate 100 and provided with a prominence and depression pattern 113, a hard layer 120 formed on a surface of the pattern portion 110, and a separation layer 130 formed on a surface of the hard layer 120.

The substrate 100 supports the pattern portion 110 formed on an upper portion of the substrate 100, and preferably, but not necessarily, is made of hard materials such as quartz or glass or soft materials such as Polyethylene Terephthalate (PET) and Polycarbonate (PC), through which ultraviolet rays can be transmitted.

The pattern portion 110 comprises a buffer layer 111 formed on an entire surface of the substrate 100, and the prominence and depression pattern 113 formed on the buffer layer 111 to protrude from the buffer layer 111 and having a nano-size. The pattern portion 110 may be made of an ultraviolet cured polymer, based on acrylate, urethane, or polydimethysiloxane, which is a material with elasticity and flexibility, and comes in uniform and stable contact with a polymer thin film, on which structures with a nano-size are imprinted, and a nano-imprint mold of the present invention, between the polymer thin film and the nano imprint mold.

The buffer layer 111 of the pattern portion 110 and the prominence and depression pattern 113 integrated therewith are made of an identical material. The above-listed ultraviolet cured polymers have an advantage in that a pattern of a master mold can be easily formed on the pattern portion 110 using ultraviolet rays transmitting the substrate 100. Further, in order to uniformly replicate a nano pattern in a large area, it is preferred, but not necessary, to deform the pattern portion 110, formed of material with flexibility, along the surface of the substrate on which a structure with a nano-size is imprinted.

Preferably, but not necessarily, the buffer layer 111, which is formed as the lower portion of the pattern portion 110, has a thickness narrower than 1 mm, and a thickness twenty or more times than that of the prominence and depression pattern 113. This is to minimize the deformation of the prominence and depression pattern 113 during the imprinting using the nano-imprint mold of the present invention by causing a portion of the buffer layer 111 on which the pattern is not formed to absorb most of the deformation.

The hard layer 120 is formed on all surfaces of the pattern portion 110 to correspond to the prominence and depression of the pattern 113. The hard layer 120 formed of a material having a higher hardness than that of the pattern portion 110 prevents the prominence and depression pattern 113 formed of a flexible material from being deformed or damaged during the imprinting, thereby improving durability of the nano-imprint mold of the present invention and the accuracy of the replication pattern.

The hard layer 120 with these characteristics is preferably, but not necessarily, made of an oxide material with ultraviolet permeability, such as silicon oxide ($SiO_2$) or Indium Tin Oxide (ITO). Where the hard layer 120 is used as a thermostatic mold, a metal, such as Aluminum, Chrome, Tantalum, or Nickel on which a natural oxide layer is formed, may be used as a material for the hard layer 120.

The separation layer 130 is formed on an entire surface of the hard layer 120, and facilitates the separation of the polymer layer, on which the nano scaled structure is imprinted, from the nano-imprint mold of the present invention.

Preferably, but not necessarily, the separation layer 130 is a Self Assembled Monolayer (SAM). In the case where the hard layer 120 is made of a silicon oxide material, since the surface of the silicon oxide layer has an hydroxyl radical (OH—), the separation layer 130 more preferably is the SAMs of organosilicon series including tridecafluoro-1, 1, 2, 2-tetrahydrooctyltrichlorosilane (FOTS), perfluorodecyltrichlorosilane (FDTS), octadecyl trichlorosilane (OTS), and dimethyldichlorosilane (DDMS), etc.

The nano-imprint mold of the present invention with the above-mentioned configuration is formed so that the substrate 100 has a thickness of 500 μm, the buffer layer 111 has a thickness of 20 μm, the prominence and depression pattern 113 has a thickness of 300 nm and a pitch of 400 nm, the hard layer 120 has a thickness of 5 nm, and the separation layer 130 has a thickness of 5 nm.

Hereinafter, a method of manufacturing the nano imprint mold according to an exemplary embodiment of the present invention will be described in detail with reference to the accompanying drawings.

Figure 2:
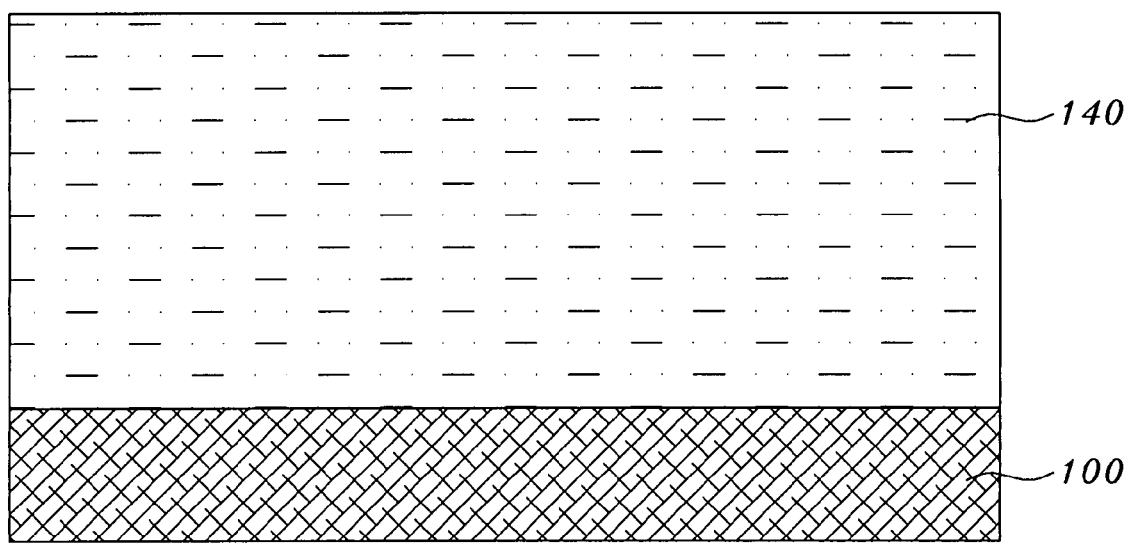
FIGS. 2, 3 and 4 are sectional views showing a configuration of the mold manufactured by a method of manufacturing the nano-imprint mold according to an exemplary embodiment of the present invention, in which layers are formed on a substrate.
Figure 3:
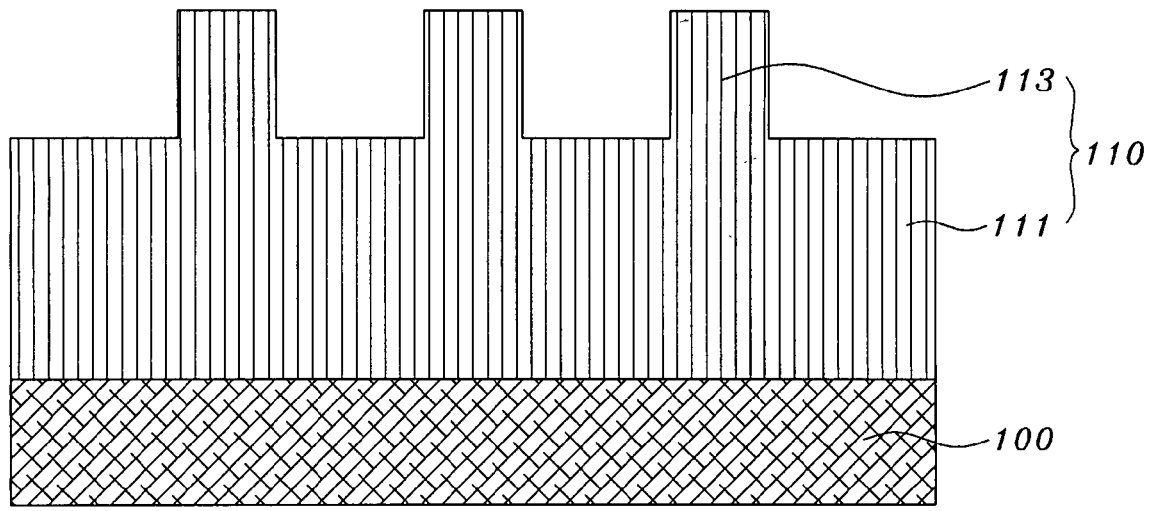
Figure 4:
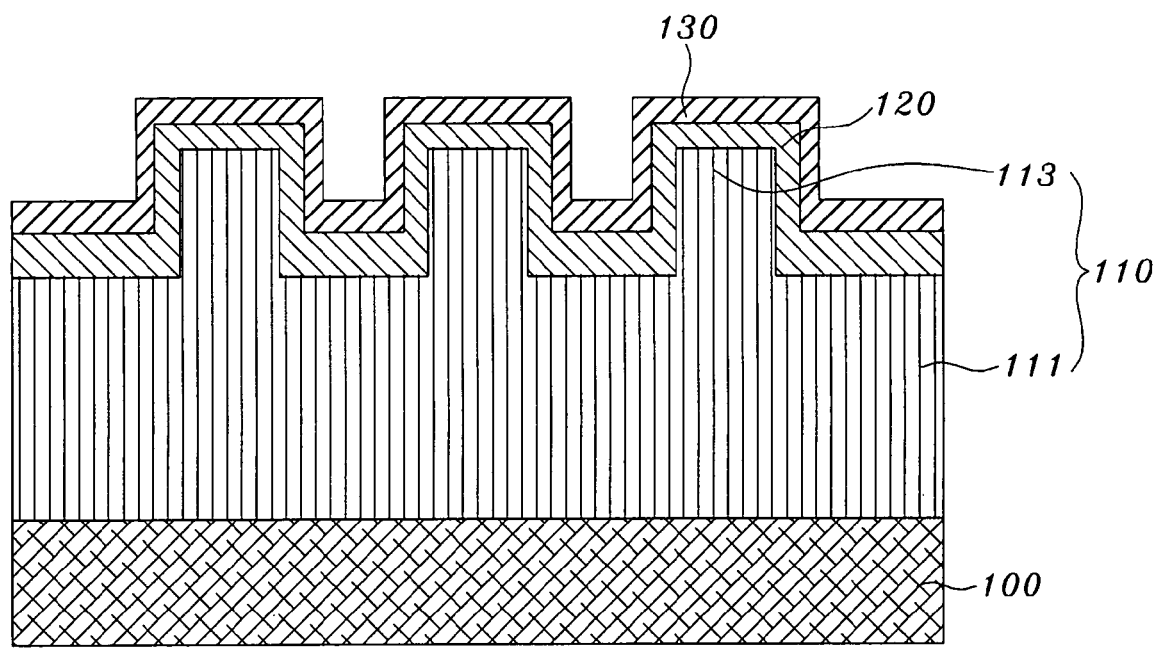

FIGS. 2 to 4 are sectional views showing structures formed on the substrate according to the method of manufacturing the nano-imprint mold consistent with the present invention. In FIGS. 2 to 4, the same reference numerals are used to indicate structural elements with the same structure and function.

As shown in FIG. 2, according to the method of manufacturing the nano-imprint mold consistent with the present invention, a polymer layer 140 is formed on the substrate 100. The polymer layer 140 is formed in such a manner that an ultraviolet cured polymer is coated on the substrate 100 by a spin coating. The ultraviolet cured polymer preferably, but not necessarily, comprises polymers based on acrylate, urethane, or polydimethylsiloxane (PDMS), etc., which have flexibility thereof after being cured.

Further, in order to increase adhesive force between the substrate 100 and the polymer 140, surface treatment of the substrate 100 may be carried out before the polymer layer 140 is formed. The surface treatment is carried out differently according to a material of the substrate 100. If the material of the substrate 100 is quartz or glass, adhesion promoter based on trialkoxy silane, or hexamethyldisilazane, etc. is coated on the substrate 100. If the material of the substrate 100 is Polyethylene Terephthalate (PET) or Polycarbonate (PC), ultraviolet rays may be emitted on the surface of the substrate 100 in order to activate the surface of the substrate 100.

As shown in FIG. 3, a master mold on which the nano-pattern is formed in advance is disposed on the substrate 100 on which the polymer layer 140 is formed, and then the polymer layer 140 is cured by emitting the ultraviolet rays. Thus, the pattern portion 110 can be formed, which comprises the buffer layer 111 and the prominence and depression pattern 113 integrally formed with the buffer layer 111. The master mold in which the nano-pattern of the prominence and depression pattern 113 is formed may be formed by a method such as a lithographic process.

The nano pattern of the master mold is replicated as the prominence and depression pattern 113 on the polymer layer 140. Preferably, but not necessarily, the buffer layer 111 is formed to have a thickness thinner than 1 mm, and a thickness twenty times thicker than that of the prominence and depression pattern 113.

As shown in FIG. 4, the hard layer 120 and the separation layer 130 are sequentially formed on the surface of the pattern portion 110.

The hard layer 120 is formed on the pattern portion 110 in such a manner that silicon oxide ($SiO_2$) is deposited on the surface of the pattern portion 110 by Plasma Enhanced Chemical Vapor Deposition (PECVD), so that the prominence and depression pattern 113 formed on the pattern portion 110 is replicated to the hard layer 120. The hard layer 120, which is formed of the silicon oxide with a hardness higher than that of the pattern portion 110 in order to protect the prominence and depression pattern 113, preferably, but not necessarily, has a thickness corresponding to that of the prominence and depression pattern 113, more preferably, a thickness of several nms in the pattern with the nano-size. During the PECVD process, the hard layer 120 is preferably formed under a condition of a temperature below a separation-transition temperature of the polymer forming the pattern portion 110, in order to prevent the deterioration of the pattern portion 110 formed of the polymer.

On the other hand, the separation layer 130 is formed on the hard layer 120 through a process of vapor-depositing or dipping a hydrophobic organosilicon based SAM. At this time, hydroxyl radical is distributed on the surface of the hard layer 120 formed of the silicon oxide. Therefore, if the organosilicon based SAM is formed on the hard layer 120, it increases cohesion between the hard layer 120 and the separation layer 130. Especially, in order to enhance the surface energy of the hard layer 120 by increasing the distribution of the hydroxyl radical on the hard layer 120, the surface treatment is carried out for the surface of the silicon oxide, which forms the hard layer 120, by using ultraviolet ray or ozone, etc. As a result, it is possible to enhance the cohesion between the hard layer 120 and the separation layer 130.

As described above, the nano-imprint mold of the present invention can be achieved by sequentially forming the hard layer 120 and the separation layer 130 on the pattern portion 110.

As described above, the following advantages can be obtained consistent with the present invention.

In the nano-imprint mold of the present invention, the hard layer is formed on the prominence and depression pattern integrated with the buffer layer, so that an original pattern can be uniformly replicated on the substrate with the irregular surface. Further, the pattern can be prevented from being damaged by pressure and being contaminated by synthetic resin, resulting in the improvement of the accuracy and durability of the pattern.

In addition, the present invention provides the method of manufacturing the nano imprint mold, by which the nano-imprint mold with the above-mentioned structure can be easily manufactured.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A nano-imprint mold comprising:
   a substrate;
   a pattern portion having a prominence and depression pattern formed on the substrate;
   a hard layer formed of a material with a hardness higher than the pattern portion on a surface of the pattern portion; and
   a separation layer formed on a surface of the hard layer,
   wherein the substrate is formed of a material through which ultraviolet ray is permeable;
   wherein the pattern portion has the prominence and depression pattern formed on a buffer layer covering an entire surface of the substrate, the buffer layer of the pattern portion and the prominence and depression pattern integrated therewith are made of an identical material, the buffer layer has a thickness less than 1 mm, and said thickness is at least twenty times more than that of the prominence and depression pattern; and
   wherein the separation layer is formed of a Self Assembled Monolayer (SAM) based on organosilicon group.

2. The nano-imprint mold as claimed in claim 1, wherein the pattern portion is formed of a material of an ultraviolet cured polymer.

3. The nano-imprint mold as claimed in claim 1, wherein the hard layer is formed of a material selected from at least one of a silicon oxide and Indium Tin Oxide (ITO).

4. The nano-imprint mold as claimed in claim 1, wherein the hard layer is formed of a material selected from at least one of Aluminum (Al), Chrome (Cr), Tantalum (Ta), or Nickel (Ni).

* * * * *